United States Patent [19]

Bachmann et al.

[11] Patent Number: 5,200,231
[45] Date of Patent: Apr. 6, 1993

[54] METHOD OF MANUFACTURING POLYCRYSTALLINE DIAMOND LAYERS

[75] Inventors: Peter K. Bachmann, Aachen; Hans Lydtin, Stolberg; Arnd Ritz, Huckelhoven, all of Fed. Rep. of Germany

[73] Assignee: U.S. Philips Corporation, New York, N.Y.

[21] Appl. No.: 820,029

[22] Filed: Jan. 10, 1992

Related U.S. Application Data

[63] Continuation of Ser. No. 570,237, Aug. 17, 1990, abandoned.

[30] Foreign Application Priority Data

Aug. 17, 1989 [DE] Fed. Rep. of Germany ....... 3927136

[51] Int. Cl.$^5$ .................. B05D 3/06; C23C 16/26
[52] U.S. Cl. .................... 427/573; 427/249; 427/122; 427/314; 427/577; 427/575; 423/446; 428/408
[58] Field of Search ............. 427/38, 39, 45.1, 249, 427/122, 314; 423/446; 428/408; 156/DIG. 68

[56] References Cited

U.S. PATENT DOCUMENTS 4,919,974  4/1990  McCune et al. .............. 427/249
4,940,015  7/1990  Kobashi et al. .............. 118/723
5,023,109  6/1991  Chin et al. .................. 427/45.1

FOREIGN PATENT DOCUMENTS 60-200898  10/1985  Japan .
62-256795  11/1987  Japan .
01-018991   1/1989  Japan .
01-172294   7/1989  Japan .
01-203293   8/1989  Japan .

Primary Examiner—Shrive Beck
Assistant Examiner—Roy V. King
Attorney, Agent, or Firm—Norman N. Spain

[57] ABSTRACT

Method of manufacturing polycrystalline diamond layers, in which diamond crystallites are deposited by means of Chemical Vapour Deposition (CVD) on a substrate heated to a temperature ranging between 450° and 1200° C. from a gas phase comprising hydrogen and $\leq 30\%$ of a carbon-containing gas at a pressure ranging between $10^{-5}$ and 1 bar, in which method the substrate is contacted with a gas phase having an energy content which varies in time, such that at least at the start of the deposition process the substrate is in contact with a gas phase having an energy content which is suitable for nucleating diamond crystallites in the gas phase, whereafter the substrate is contacted with a gas phase having an energy content which is increased with respect to the content at the start of the process and further diamond crystallites are formed in situ on the substrate surface nucleated with diamond crystallites formed in the gas phase.

10 Claims, No Drawings

METHOD OF MANUFACTURING POLYCRYSTALLINE DIAMOND LAYERS

This is a continuation of application Ser. No. 07/570,237 filed Aug. 17, 1990 now abandoned.

BACKGROUND OF THE INVENTION

The invention relates to a method of manufacturing polycrystalline diamond layers, in which diamond crystallites are deposited by means of Chemical Vapour Deposition (CVD) on a substrate heated to a temperature ranging between 450° and 1200° C. from a gas phase comprising hydrogen and $\leq 30\%$ of a carbon-containing gas at a pressure ranging between $10^{-5}$ and 1 bar.

It is known that the manufacture of synthetic diamond is not only possible at a high pressure and a high temperature but also at atmospheric pressure or in the sub-pressure range by way of the chemical gas phase deposition process (CVD) (in this respect reference is made to U.S. Pat. No. 3,030,187).

In addition to the deposition parameters of pressure, concentration of the reactants in the gase phase and temperature of the gas phase, the condition of the substrate surface also plays a role in the morphology of layers deposited from the gas phase by means of CVD and the period of time required to build up the layer. It is, for example, advantageous to roughen substrate surfaces by means of grained grinding means of or with particularly hard materials, or by spraying powders, particularly of hard materials, on the substrate surface. Both methods of preparing the substrate surfaces have, however, certain drawbacks: the substrates must always be prepared outside the reactor used for depositing the diamond layers, which always involves the risk of contamination of the substrate surfaces, particularly because of their relatively large surface roughness. Due to spraying hard material powders, for example, by applying diamond powders manufactured by means of high-pressure synthesis, a homogeneous growth of the layer thickness is not only jeopardized by the introduction of contaminations but also because it is difficult to apply powder layers on the substrate in a homogeneous manner. The powder material which is applied may be easily lost when the substrates are introduced into the reactor or it may be displaced in its surface regions, which in both cases leads to disturbances of the subsequent build-up of layers. To mitigate these unwanted effects, it has been attempted to nucleate the substrate surfaces by applying diamond powder-containing suspensions. It is true that the homogeneity of the substrate surface nucleation is then improved, but an additional risk of contamination of the substrate surfaces is involved during the steps of suspension and removal of excess liquid phase. In all cases it is a drawback to resort to diamond powders manufactured by means of high-pressure synthesis for nucleating substrate surfaces, because these powders may generally be contaminated during manufacture with impurity atoms such as, for example iron, nickel, titanium, which impurities are subjected, along with the nucleated substrates, to the deposition process for in situ formation of diamond layers.

In the in situ manufacture of diamond layers a further problem is that it is desirable to nucleate the substrate surfaces several times during the process of growing the layer: for this purpose the process of growing the layer must be interrupted each time, which involves the risk of contaminating the diamond layer which has already been deposited, because the substrate must be removed from the reactor whenever a new nucleation step is started.

SUMMARY OF THE INVENTION

It is an object of the invention to provide a method of manufacturing polycrystalline diamond layers on a substrate, which method is improved as compared with the method described in the opening paragraph, and which substantially reduces the risk of contamination during nucleation of the substrate surfaces with diamond crystallites, while the formation of homogeneous, coherent diamond layers on the substrate is ensured in a reproducible manner and the substrate surfaces can be nucleated several times during the overall process of providing layers under extremely pure conditions.

According to the invention this object is achieved in that the substrate is contacted with a gas phase having an energy content which varies in time, such that at least at the start of the deposition process the substrate is in contact with a gas phase having an energy content which is suitable for nucleating diamond crystallites in the gas phase, whereafter the substrate is contacted with a gas phase having an energy content which is increased with respect to the content at the start of the process and further diamond crystallites are formed in situ on the substrate surface nucleated with diamond crystallites formed in the gas phase.

DETAILED DESCRIPTION OF THE PREFERRED EMBODIMENTS

In accordance with advantageous further embodiments of the method according to the invention a plasma-induced CVD process is used in which a microwave plasma is preferably generated.

Since the energy required for the deposition process is varied in time so that the energy at the start of the deposition process is reduced to such an extent that diamond nuclei are nucleated in the gas phase, which nuclei are deposited on the substrate, whereafter the energy supply is increased and then maintained constant so that further diamond crystallites are formed in situ on the nucleated substrate, while the energy supply can be repeatedly varied in time during the process, a pulsating microwave plasma is generated by means of which the nucleation process within the reactor can be performed without interrupting the process and which can also be repeated as often as is desired during the deposition process, which results in a higher deposition rate of the diamond layer deposited in situ as compared with a deposition process in which the substrate is not nucleated several times.

According to a further advantageous embodiment of the method of the invention, a microwave plasma is generated by supplying microwave energy at a frequency of 2.45 GHz into the reactor. At the start of the process, the power developed by the microwave energy is varied between 400 W and 1300 W at a frequency of approximately 10 Hz and after a period of approximately 30 min the microwave power is adjusted to a constant value of approximately 1000 W, which is maintained for a period of approximately 900 min. The power maintaining the gas discharge and supplied to the reaction zone is also reduced and subsequently increased again during its variation at the start of the plasma deposition process or when the pulsating energy supply is repeated several times. The power reduction may lead to a complete termination of the discharge process with respect to time and to a variation of the spatial extension of the discharge zone or the plasma density and consequently the substrate is temporarily in contact with a gas phase having an energy content which is suitable for nucleating diamond crystallites in the gas phase and temporarily with a gas phase having an increased energy content, forming further diamond crystallites in situ on the substrate surface nucleated with diamond crystallites formed in the gas phase.

This can also be achieved if according to advantageous further embodiments of the method according to the invention a thermally induced CVD process or a CVD process induced by UV radiation, for example pulsed laser radiation is used, or if the reaction zone with the maximum energy content is moved relative to the substrate so that with a constant supply of energy which is sufficiently high for the in situ growth of diamond crystallites on the substrate, this substrate or the energy source are moved relative to each other in such a way that at least at the start of the deposition process the substrate is in a zone having a reduced energy content, in which zone diamond crystallites are nucleated, whereafter the substrate and/or the energy source are moved in such a way that the substrate is in a zone having an increased energy content, in which zone further diamond crystallites are formed in situ on the substrate surface nucleated with diamond crystallites formed in the gas phase.

In all above-mentioned embodiments of the deposition process the substrate is in contact for a certain period of time with a gas phase composition which varies in time, i.e. the saturation degree of the gas phase with the species to be deposited is varied in time due to the pulsating operation. If the required reaction energy is not continuously applied to the reaction, i.e. if with a plasma-induced deposition a generally continuously burning plasma is replaced by a pulsating plasma for a short period of time, a gas phase having a reduced energy content is generated during the period of time when the power is reduced, which results in a nucleation of diamond crystallites already in the gas phase. These diamond crystallites are distributed from the gas phase on the entire substrate surface and effect a nucleation of the substrate. This nucleation leads to a decrease of the period of time which is required to build up a coherent diamond layer. The nucleation step can be repeated at any arbitrary point of time during the deposition process. To this end the process parameters of energy supply or positioning of the substrate relative to the reaction zones with maximum energy content are modified during the deposition process in such a way that the formation of diamond crystallites, as described above, does not take place in situ on the substrate surface but in the gas phase above the substrate.

In accordance with an advantageous further embodiment of the method according to the invention monocrystalline silicon discs are used as substrates. However, metal substrates, for example, of tungsten, titanium or molybdenum, substrates of oxidic compounds such as aluminum oxide or quartz, and substrates of graphite or silicon nitride are also suitable.

The invention and its method will now be described in greater detail with reference to an embodiment.

Hydrogen is supplied in a controlled manner to a reactor in which a cleaned silicon monocrystal substrate of approximately 2.5 cm diameter and approximately 0.25 mm thickness, as is also used for the manufacture of integrated semiconductor circuits, is mounted on a heated substrate holder of graphite. The overall flow is 200 sccm, the pressure in the reactor is adjusted to approximately 50 mbar and the substrate is heated to a temperature of 950° C.

A plasma is maintained in the reactor by supplying microwave energy at a frequency of approximately 2.45 GHz. The supplied microwave power is varied by a frequency of approximately 10 Hz in the range between 400 W and 1300 W so that the spherically shaped plasma periodically changes its optically visible expansion at this frequency, of approximately 10 Hz, between a diameter of approximately 5 cm (at a power of 1300 W) and <0.5 cm (at a power of 400 W).

In this mode an amount of 0.5% of methane is admixed to the hydrogen gas. The pulsating plasma state is maintained for a period of approximately 30 min. After this period the microwave power supplied to the plasma is adjusted to a constant value of approximately 1000 W and the deposition process is continued for a period of approximately 900 min under unchanged temperature, pressure and concentration conditions. In this way coherent diamond layers having a thickness of approximately 7 $\mu$m are obtained on the substrates.

In a comparative experiment, which was performed under the above described conditions but with a microwave power of 1000 W which was constantly supplied during a period of 900 min, diamond layers which did not evenly cover the substrate surface but had holes at many locations and a layer thickness of only about 0.5 $\mu$m were obtained on non-nucleated substrates.

We claim:

1. A method of manufacturing a layer of polycrystalline diamond on a substrate by a plasma induced chemical vapor deposition process comprising positioning a substrate in a reactor, heating said substrate to a temperature between 450° C.-1200° C., introducing a gas phase comprising hydrogen and $\leq 30\%$ by volume of a carbon containing gas into said reactor at a pressure of between $10^{-5}-1$ bar so as to contact said heated substrate, coupling microwave energy at a frequency of 2.45 GHz into the reactor as the energy required for the deposition process, generating a pulsating plasma at the start of the deposition process by varying the power of the microwave energy coupled into the reactor between a low and a high power level of about 400 W and 1300 W respectively during a first period so as to cause diamond crystal nuclei to form from the gas phase and deposit on said substrate and, after said first period, adjusting the power of the microwave energy coupled into the reactor to a constant power level between said low and high power levels for a second period to thereby cause a layer of diamond crystallites to form on said diamond crystal nuclei.

2. The method of claim 1 wherein during the first period the power of the microwave energy coupled into the reactor is varied by a frequency variation of approximately 10 Hz.

3. A method as claimed in claim 1, characterized in that hydrocarbon gases containing methyl groups are used.

4. A method of manufacturing a layer of polycrystalline diamond on a substrate by a plasma induced chemical vapor deposition process comprising positioning a substrate in a reactor, heating said substrate to a temperature between 450° C.-1200° C., introducing a gas phase comprising hydrogen and $\leq 30\%$ by volume of a carbon containing gas into said reactor at a pressure of between $10^{-5}$–1 bar so as to contact said heated substrate, coupling microwave energy at a frequency of 2.45 GHz into the reactor as the energy required for the deposition process by generating a pulsating plasma at the start of the deposition process by varying the power of the microwave energy coupled into the reactor by a frequency variation of approximately 10 Hz between 400 and 1300 W during a first period so as to cause diamond crystal nuclei to form from the gas phase and deposit on said substrate and, after said first period, adjusting the power of the microwave energy coupled into the reactor to a constant value of approximately 1000 W for a second period to thereby cause a layer of diamond crystallites to form on said diamond crystal nuclei.

5. The method of claim 4 wherein the carbon gas is a hydrocarbon gas employed in the amount of about 0.5% by volume.

6. The method of claim 5 wherein the hydrocarbon gas contains a methyl group.

7. The method of claim 4 wherein the microwave power coupled into the reactor is kept at a constant value of approximately 1000 W for a period of approximately 900 minutes while the diamond crystallites are being formed on the diamond crystal nuclei.

8. A method as claimed in claim 4, characterized in that monocrystalline silicon discs are used as substrates.

9. A method as claimed in claim 1, characterized in that the pressure in the reactor is adjusted to a value of approximately 50 mbar.

10. A method as claimed in claim 6, characterized in that methane is used as a hydrocarbon gas.

* * * * *